US008380451B2

(12) United States Patent
Chen et al.

(10) Patent No.: US 8,380,451 B2
(45) Date of Patent: Feb. 19, 2013

(54) SYSTEM AND METHOD FOR MONITORING THE STATE OF HEALTH OF A POWER ELECTRONIC SYSTEM (75) Inventors: Chingchi Chen, Ann Arbor, MI (US); Zhenxian Liang, Canton, MI (US); Michael W. Degner, Novi, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 738 days.

(21) Appl. No.: 12/502,358

(22) Filed: Jul. 14, 2009

(65) Prior Publication Data

US 2011/0015881 A1 Jan. 20, 2011

(51) Int. Cl.
*G01R 15/00* (2006.01)
*G01R 31/00* (2006.01)
*G01R 31/02* (2006.01)

(52) U.S. Cl. ............. 702/57; 702/58; 702/182; 324/537
(58) Field of Classification Search .................. 702/57, 702/58, 182; 324/537
See application file for complete search history.

(56) References Cited

U.S. PATENT DOCUMENTS

| | | | |
|---|---|---|---|
| 5,383,083 A | 1/1995 | Shinoda et al. | |
| 5,875,414 A * | 2/1999 | Tsutsumi | 702/99 |
| 6,888,469 B2 | 5/2005 | Seferian | |
| 7,035,064 B2 | 4/2006 | Schimanek et al. | |
| 7,176,804 B2 | 2/2007 | Norrena et al. | |
| 7,356,441 B2 * | 4/2008 | Kerkman et al. | 702/182 |
| 2003/0035463 A1 * | 2/2003 | Breinlinger | 374/178 |
| 2006/0066336 A1 * | 3/2006 | Otremba et al. | 324/760 |

OTHER PUBLICATIONS

D. Tournier, et al., "Current Sensing for SiC Power Devices;" Materials Science Forum, vols. 527-529; 2006; pp. 1215-1218.
Mahera Musallam et al. Open Loop Real-Time Power Electronic Device Junction Temperature Estimation; 2004 IEEE International Symposium on Industrial Electronics, vol. 2; May 4-7, 2004; pp. 1041-1046.

* cited by examiner

*Primary Examiner* — Andrew Schechter
*Assistant Examiner* — L. Anderson
(74) *Attorney, Agent, or Firm* — David B. Kelley; Brooks Kushman P.C.

(57) ABSTRACT

A system and method for monitoring the state of health of a power electronic system. Data representing an initial expected temperature of the circuit element and an initial value of an electrical parameter of the circuit element is obtained. An electrical pulse is applied to the circuit element to heat the circuit element. After the electrical pulse decays to a predetermined value, the electrical parameter of the circuit element is sensed and a subsequent value of the electrical parameter is obtained. A subsequent temperature of the circuit element is estimated based on the initial expected temperature of the circuit element, the initial and subsequent values of the electrical parameter, and the predetermined value of the electrical pulse. Based on the subsequent temperature, the signal that indicates whether the circuit element is operating as expected is generated.

19 Claims, 7 Drawing Sheets

SYSTEM AND METHOD FOR MONITORING THE STATE OF HEALTH OF A POWER ELECTRONIC SYSTEM

BACKGROUND

1. Technical Field

System and method for monitoring the state of health of a power electronic system.

2. Background Art

Power conversion systems, such as median electric power conversion systems and motor drive systems, have gained increasing attention in automotive applications. Power conversion systems typically include various power semiconductor devices, such as a power switch. The power switch may include a diode and an insulated gate bipolar transistor (IGBT). Many of these semiconductor devices switch hundreds amperes (A) and hundreds volts (V) at a high rate, often in the tens of kilohertz (kHz). During these switching operations, the semiconductor device may dissipate a large amount of heat on order of kilowatts (kWs). Furthermore, the large amount of heat can degrade the semiconductor device and cause the semiconductor device to reach a high temperature. The high temperature of the semiconductor device can cause the semiconductor device to be degraded or fail unless the semiconductor device is cooled to a lower temperature.

Various materials can be used to fabricate the semiconductor device. However, the efficiency and effectiveness of the material may be limited to various operating temperatures due to inherent properties of the material. If the material used to fabricate the semiconductor device overheats, the semiconductor device may degrade or fail unless the semiconductor device is cooled to a lower temperature. In addition, a degrading or failure of the semiconductor device can cause a power conversion system in an automotive vehicle to degrade or fail.

Many factors can impede or degrade the performance of the semiconductor device. For example, high electrical stress or large temperature excursion can reduce the performance of the semiconductor device or a module of which it is a part. As the temperature of the semiconductor device increases, the performance of the semiconductor device may be reduced.

Various electronic devices have been used to measure the temperature of a semiconductor device. For example, a thermocouple, a thermistor, or an optical thermal sensor have been used as temperature sensors in semiconductor modules. However, these devices used as temperature sensors have provided neither an in situ nor an instantaneous response.

Furthermore, inherent electrical temperature-sensitive parameters (TSPs) in various electronic devices have been used to determine the temperature of the semiconductor device. TSPs may include a voltage drop, saturation voltage, and gate threshold voltage of the semiconductor device. For example, the semiconductor device may be a diode, a bipolar transistor, an IGBT, or a field-effect transistor (FET). Using the TSPs, the temperature of the semiconductor device can be calculated and the thermal performance of the semiconductor device can be deduced. However, TSPs depend significantly on the operating conditions of the semiconductor device and typically require measuring multiple factors that affect the operation of the semiconductor device. For example, voltages of semiconductor devices depend greatly on the operation conditions, such as current, bias, and dynamic transitions. In addition, interaction of cascaded subsystems may cause a measurement of a TSP in a semiconductor device to be inaccurate.

SUMMARY

A system and method is provided for monitoring the state of health of a power electronic system. The system includes a storage medium and a controller. The controller is in communication with the storage medium and is configured to perform the method for generating the signal.

At least one processor-readable storage medium also is provided. The storage medium has processor-readable code embodied therein. The code is used to program at least one processor to perform the method of generating the signal.

The method includes obtaining data representing an initial expected temperature of the circuit element. Furthermore, an initial value of an electrical parameter of the circuit element is obtained. In addition, the method includes applying an electrical pulse to the circuit element. The electrical pulse increases the temperature of the circuit element from an initial temperature to a greater temperature. After the electrical pulse decays to a predetermined value, the electrical parameter of the circuit element is sensed and a subsequent value of the electrical parameter is obtained. Once the subsequent value of the electrical parameter is obtained, a subsequent temperature of the circuit element is estimated based on one or more of the following information: the initial expected temperature of the circuit element, the initial and subsequent values of the electrical parameter, and the predetermined value of the electrical pulse. In addition, the method includes generating the signal based on the subsequent temperature. The signal indicates whether the circuit element is operating as expected.

DETAILED DESCRIPTION

Embodiments of the present invention generally provide a system and method for generating at least one signal that indicate whether an electrical circuit element, such as a semiconductor device, is operating as expected. The signal is generated based on a temperature of the circuit element that is estimated after an electrical pulse heats the circuit element. In addition to the temperature of the circuit element, the system and method may estimate a temperature difference and/or a thermal impedance of the circuit element to generate the signal indicating whether the circuit element is operating as expected. Based on the signal, a number of conditions of the circuit element may be determined, such as the reliability or health of the circuit element, whether the circuit element is overheated, deterioration or failure of the circuit element, performance of the circuit element, et cetera.

Figure 1:
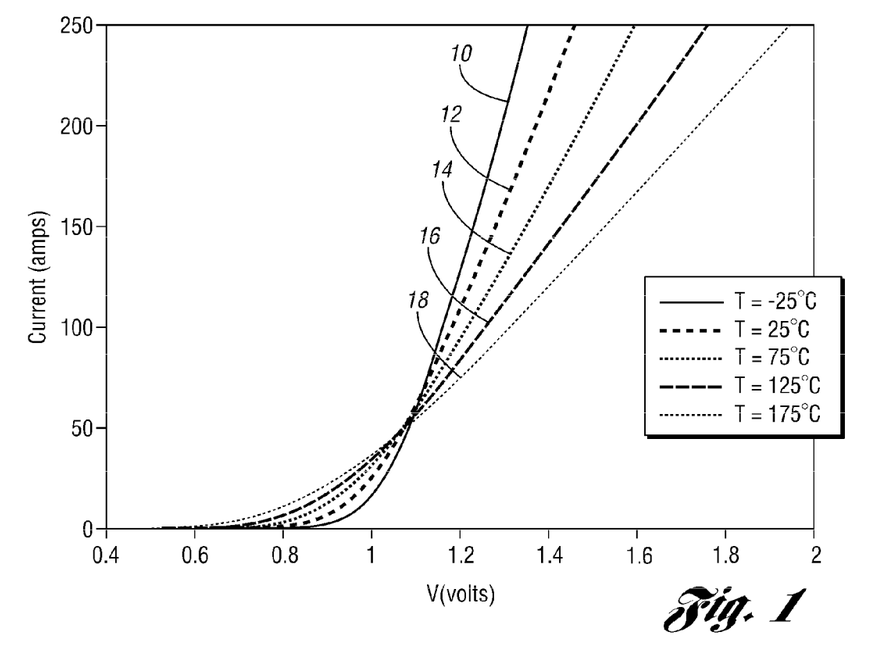
FIG. 1 is a set of graphs illustrating current flowing through a circuit element verses voltage across the circuit element for different circuit element temperatures.

Referring to FIG. 1, a set of graphs illustrates how one type of circuit element, such as an insulated gate bipolar transistor (IGBT), operates at five different temperatures. More specifically, the set of graphs show how the temperature of the circuit element affects the relationship between current flowing through the circuit element and voltage across the circuit element. For example, curve 10 represents the relationship of current verses voltage across the circuit element when the temperature of the circuit element equals −25° C. Similarly, curves 12, 14, 16, and 18 represent the relationship of current verses voltage across the circuit element when the temperature of the circuit element equals respective temperatures 25° C., 75° C., 125° C., and 175° C.

Figure 2:
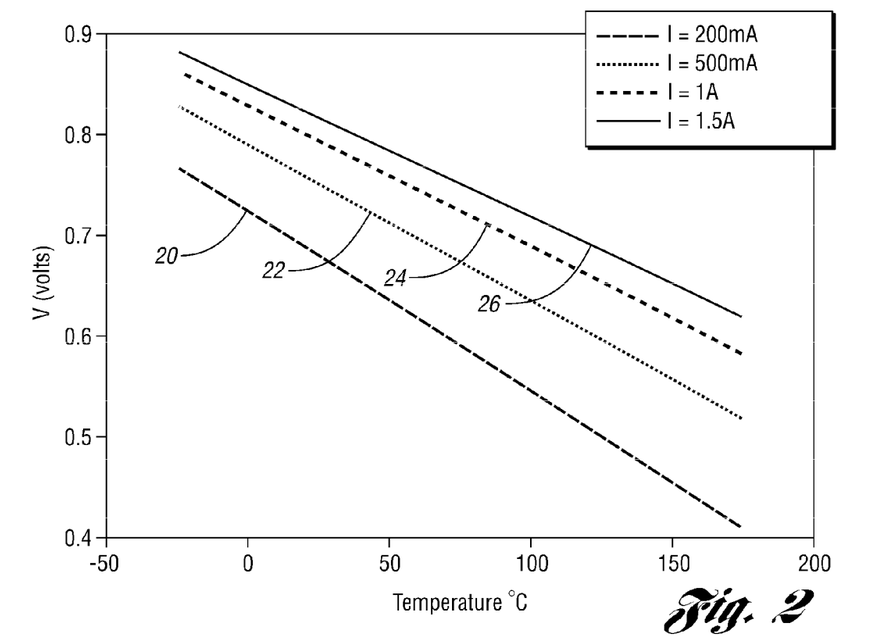
FIG. 2 is a set of graphs illustrating voltage across the circuit element versus circuit element temperature for different currents flowing through the circuit element.

FIG. 2 shows the relationships of FIG. 1 in a different way. Current flowing through the circuit element (e.g., IGBT) affects the relationship between voltage across the circuit element and the temperature of the circuit element. For example, curve 20 represents the relationship of voltage across the circuit element verses the temperature of the circuit element when current flowing through the circuit element equals 200 mA. Similarly, curves 22, 24, and 26 represent the relationship of voltage across the circuit element verses the temperature of the circuit element when current flowing through the circuit element equals respective currents 500 mA, 1000 mA, and 1500 mA. Thus, changes in the current flowing through the circuit element affects the relationship between voltage across the circuit element and the temperature of the circuit element. Since the curves shown in FIG. 2 are generally linear, equations $V=V_0+m*(T-T_0)$ or $T=T_0+(V-V_0)/m$ can represent each of the curves 20, 22, 24, and 26. Under a specific bias current, V represents the voltage drop across the circuit element at temperature T, $V_0$ represents the voltage drop across the circuit element at temperature $T_0$, and parameter "m" is the slope of the corresponding curve. The system can define $T_0$ and determine $V_0$ and "m" prior to obtaining the unique relationship between voltage V and temperature T of the circuit element. Once the system obtains the unique relationship between V and T, the system can measure voltage V across the circuit element at a known bias current to obtain temperature T. Thus, the circuit element operates as a temperature sensor or detector.

A few significant factors determine the temperature of the circuit element. One significant parameter is the thermal loss (P) of the circuit element. Another significant parameter is the thermal impedance of the circuit element.

Many factors can increase the thermal impedance in the circuit element, especially after the circuit element has been exposed to long-term stresses. High electrical stress, large temperature excursion, structural defects, physical imperfections, or a combination thereof can increase the thermal impedance of the circuit element. Structural defects and physical imperfections include cracks, lifting off, electromigration, etc. and can form in various locations in the circuit element, such as in joining layers or in a metal contact in the circuit element. Such factors that increase the thermal impedance in the circuit element can indicate deterioration, degradation, or failure of the circuit element. In addition, such factors can indicate the expected reliability and state of health of the circuit element.

When the thermal impedance in the circuit element increases, the circuit element heats at a greater rate under the same loss of thermal power than before the increase in thermal impedance in the circuit element. Therefore, the circuit element heats at a greater rate than a circuit element without electrical stress, temperature excursions, structural defects, and/or physical imperfections. When the circuit element heats at a greater rate, the temperature of the circuit element also increases at a greater rate.

The temperature and/or the rate of temperature change of the circuit element can indicate whether the circuit element has one or more problems. For example, a temperature of the circuit element that exceeds its normal value or expected value can indicate that the circuit element has a high degree of fatigue and decreased performance. In addition, the temperature and/or the rate of temperature change of the circuit element can be used to determine the reliability or health of the circuit element, whether the circuit element is overheated, whether the circuit element has failed or degraded from an expected performance level, or is otherwise not operating as expected.

Figure 3:
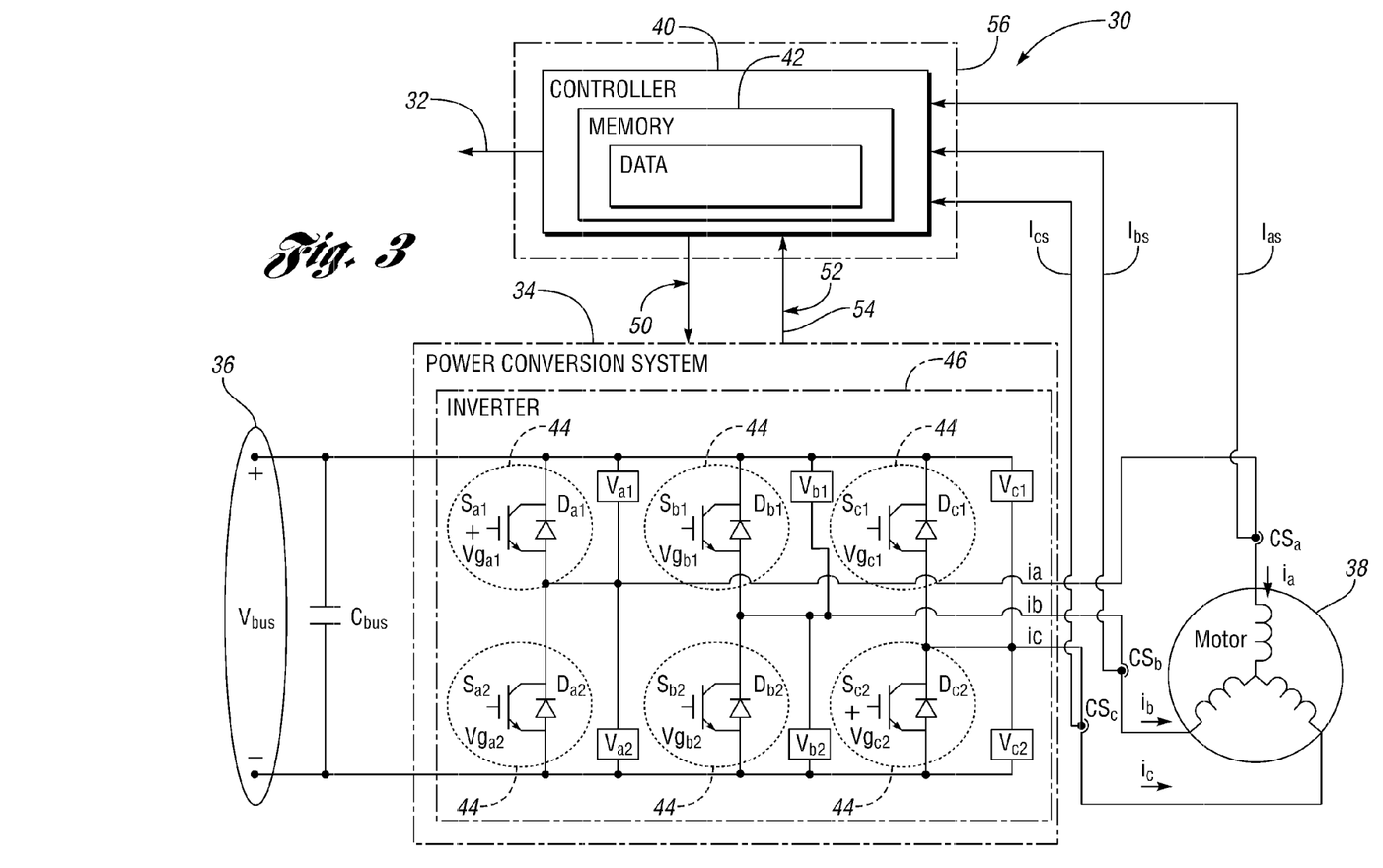
FIG. 3 is a schematic diagram illustrating a system for monitoring the state of health of a power electronic system.
Figure 4:
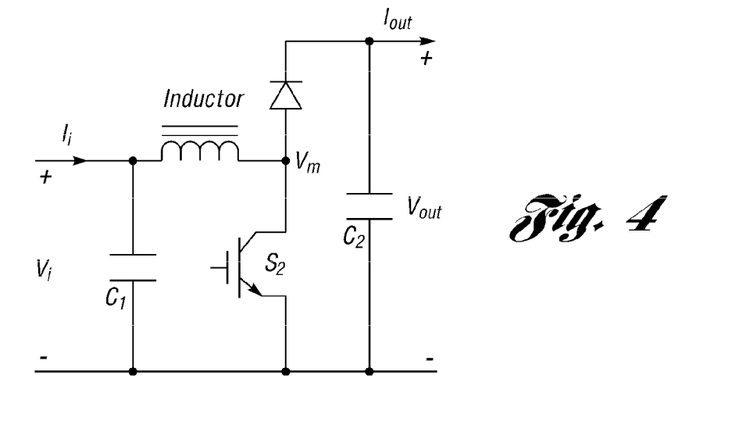
FIG. 4 is a schematic diagram illustrating a boost converter having switch $S_2$ as the circuit element.
Figure 5:
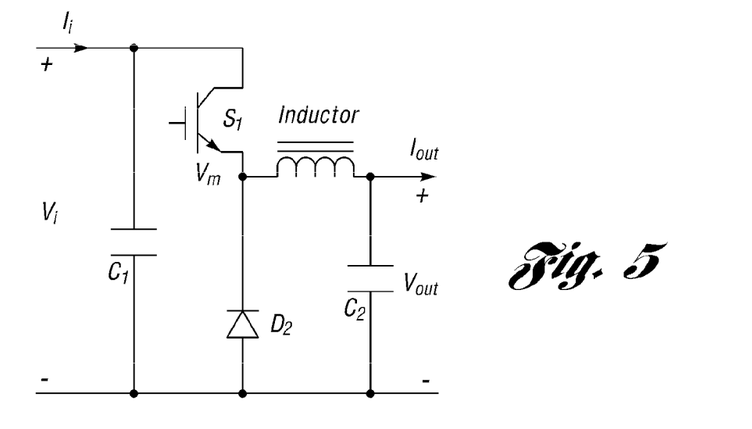
FIG. 5 is a schematic diagram illustrating a buck converter having switch $S_1$ as the circuit element.
Figure 6:
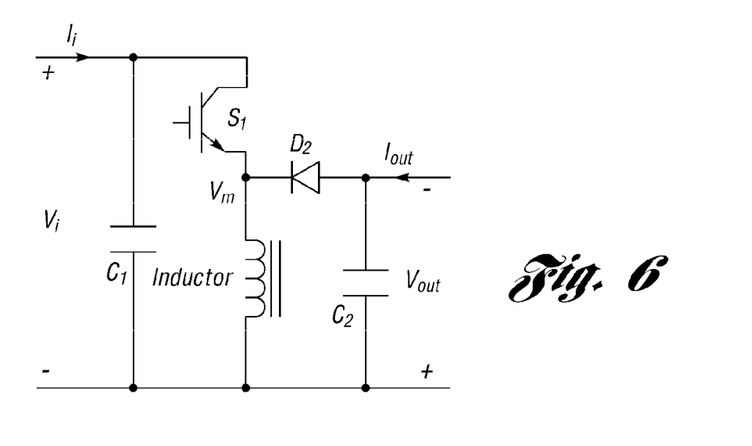
FIG. 6 is a schematic diagram illustrating a buck-boost converter having switch $S_1$ as the circuit element.

With reference to FIG. 3, a system 30 for generating a signal 32 is provided. The signal 32 indicates whether an electrical circuit element supported on a substrate is operating as expected. The system 30 of FIG. 3 is applied to a power conversion system 34 between a power supply 36 and a three-phase permanent-magnet synchronous motor (PMSM) 38 (hereinafter "motor") in an automotive vehicle. However, the system 30 may determine whether the circuit element is operating as expected in other power electronic topologies. For example, the system 30 may generate the signal 32 based on how the circuit element is operating in a boost converter (generally shown in FIG. 4), a buck converter (generally shown in FIG. 5), or a buck-boost converter (generally shown in FIG. 6). The system 30 and its method of operation are described in an integrated manner to facilitate understanding of various aspects of the invention.

Referring again to FIG. 3, the system 30 includes a controller 40 or some other type of programmable logic device to implement the method of generating the signal 32 that indicates whether the circuit element is operating as expected. To implement the method, the controller 40 executes a computer program or algorithm embedded or encoded with the method.

As shown in FIG. 3, the system 30 includes a storage medium 42 (hereinafter "memory"), such as a computer-readable storage medium, to store the program or algorithm embedded or encoded with the method. The memory 42 of FIG. 3 is shown as part of the controller 40. However, the memory 42 may be positioned in any suitable portion of the system 30. In addition to storing the computer program or algorithm, the memory 42 also stores data or information about the circuit element for the controller 40 to implement the method. For example, the memory 42 stores equations or lookup tables representing the relation between voltage across the circuit element and the temperature of the circuit element. Furthermore, the memory 42 may store the allowed maximum hot spot temperature and maximum thermal impedance. In addition, the memory 42 stores an initial expected temperature of the circuit element as well as an initial value of an electrical parameter of the circuit element.

The initial value of an electrical parameter of the circuit element corresponds to either a voltage or a current value applied to the circuit element prior to heating the circuit element. Whether the electrical parameter is a voltage or a current depends on the configuration of the system 30. Consequently, the initial value of the electrical parameter can be either a voltage value or a current value.

To further describe the system 30 and method, the system 30 is applied to the power conversion system 34 of FIG. 3. As shown, the power conversion system 34 includes power switches 44. Each of the power switches 44 may be referred to as the circuit element even though each power switch 44 includes two types of circuit elements—a diode and an IGBT. The diodes in the power switches 44 are labeled $D_{a1}$, $D_{a2}$, $D_{b1}$, $D_{b2}$, $D_{c1}$, and $D_{c2}$ while the IGBTs in the power switches 44 are respectively labeled $S_{a1}$, $S_{a2}$, $S_{b1}$, $S_{b2}$, $S_{c1}$, and $S_{c2}$.

The power conversion system 34 of FIG. 3 includes a drive system inverter 46 (hereinafter "inverter"). The inverter 46 includes the power switches 44 to convert power from the power supply 36, such as a battery, to drive the motor 38 in the automotive vehicle. More specifically, the inverter 46 in the power conversion system 34 converts direct current (DC) from the power supply 36 to alternating currents or motor phase currents $i_a$, $i_b$, and $i_c$ (illustrated in FIG. 3). In operation, the motor phase currents $i_a$, $i_b$, and $i_c$ drive the motor 38. To drive the motor 38, the controller 40 regulates motor phase currents $i_a$, $i_b$, and $i_c$ according to pre-defined patterns into windings of the motor 38. Notably, the inverter 46 may include any number of the power switches 44 or circuit elements depending on the particular configuration of the power conversion system 34.

As shown in FIG. 3, the power conversion system 34 includes current sensors $CS_a$, $CS_b$, and $CS_c$, such as hall-effect current sensors. The current sensors $CS_a$, $CS_b$, and $CS_c$ are installed in series with each phase and provide the respective feedback signals $i_{as}$, $i_{bs}$, and $i_{cs}$ (also illustrated in FIG. 3) to the controller 40. The feedback signals $i_{as}$, $i_{bs}$, and $i_{cs}$ are embedded or encoded with the amount of current flowing through the respective windings of the motor 38. The controller 40 receives and processes the feedback signals $i_{as}$, $i_{bs}$, and $i_{cs}$ to control the motor phase currents $i_a$, $i_b$, and $i_c$ such that the motor phase currents $i_a$, $i_b$, and $i_c$ flow through the respective winding of the motor 38 according to pre-defined patterns that are stored in the memory 42.

As illustrated in FIG. 3, the controller 40 transmits at least one control signal 50 to the inverter 46 in the power conversion system 34. The inverter 46 receives the control signal 50 to control the switching configuration of the inverter 46 and therefore the amount of current flowing through the respective windings of the motor 38. The switching configuration is a set of switching states of the power switches 44 in the inverter 46. In general, the switching configuration of the inverter 46 determines how the inverter 46 converts power from the power supply 36 to the motor 38.

To control the switching configuration of the inverter 46, the inverter 46 changes the switching state of each power switch 44 in the inverter 46 to either the ON state or the OFF state based on the control signal 50. To switch the power switch 44 to either the ON or OFF states, the inverter 46 controls the gate voltage ($V_g$) applied to each power switch 44 and therefore the switching state of each power switch 44. Gate voltages $Vg_{a1}$, $Vg_{a2}$, $Vg_{b1}$, $Vg_{b2}$, $Vg_{c1}$, and $Vg_{c2}$ (shown in FIG. 3) control the switching state of the respective power switches 44. Changing the switching states of one or more of the power switches 44 in the inverter 46 can change the switching configuration of the inverter 46 and therefore how the inverter 46 converts power from the power supply 36 to the motor 38.

The power conversion system 34 may include a number of voltage sensors, which are labeled $V_{a1}$, $V_{a2}$, $V_{b1}$, $V_{b2}$, $V_{c1}$, and $V_{c2}$ in FIG. 3. The power conversion system 34 may include fewer or additional voltage sensors depending on the number of power switches 44 in the inverter 46. The voltage sensors measure voltage across the respective circuit elements in the inverter 46. More specifically, voltage sensor $V_{a1}$ measures the voltage ($V_{a1}$) across the power switch 44 that has IGBT $S_{a1}$ and diode $D_{a1}$. Likewise, voltage sensors $V_{a2}$, $V_{b1}$, $V_{b2}$, $V_{c1}$, and $V_{c2}$ measure respective voltages ($V_{a2}$, $V_{b1}$, $V_{b2}$, $V_{c1}$, and $V_{c2}$) across the respective power switches 44 having respective IGBTs ($S_{a2}$, $S_{b1}$, $S_{b2}$, $S_{c1}$, and $S_{c2}$) and diodes ($D_{a2}$, $D_{b1}$, $D_{b2}$, $D_{c1}$, and $D_{c2}$). The voltage measurements from the voltage sensors are transmitted to the controller 40 via a feedback signal 52 along electrical communication path 54. In addition, the power conversion system 34 may include differential amplifiers or isolation amplifiers to amplify the feedback signal 52 embedded or encoded with the voltage measurements from the voltage sensors $V_{a2}$, $V_{b1}$, $V_{b2}$, $V_{c1}$, and $V_{c2}$. Furthermore, the power conversion system 34 may include analog-to-digital (A/D) converters to digitize the outputs of the differential amplifiers or isolation amplifiers, such that the controller 40 receives the feedback signal 52 with the voltage measurements in a digital format.

As illustrated in FIG. 3, the controller 40 may be part of an electronic-device diagnostic system 56. The electronic-device diagnostic system 56 monitors the power conversion system 34 in the automotive vehicle and can diagnose problems with various electronic devices in the power conversion system 34. Alternatively, the controller 40 may be part of the power conversion system 34 in the automotive vehicle. For example, the controller 40 may part of the inverter 46 or some other part of the power conversion system 34.

Figure 7:
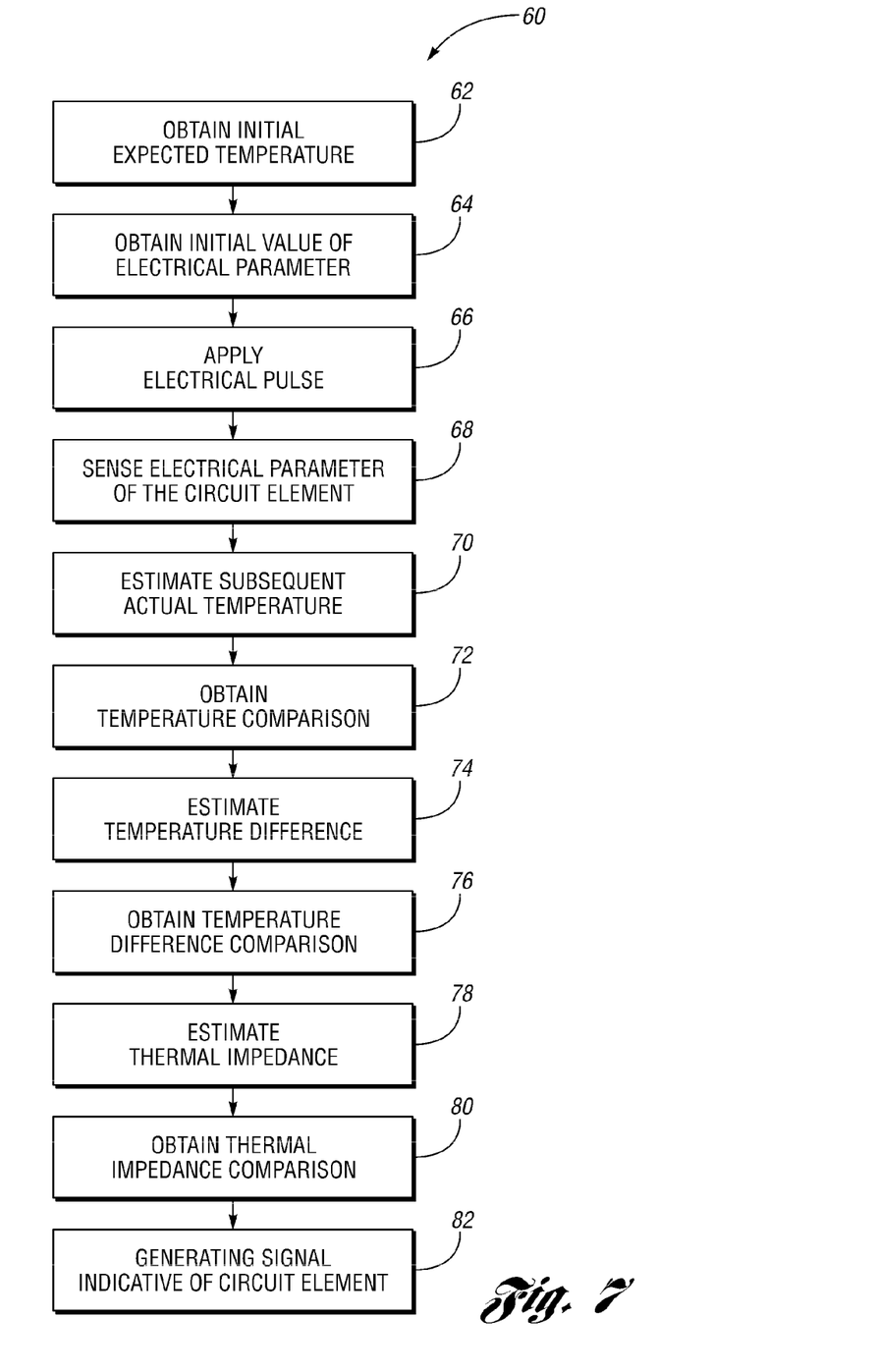
FIG. 7 is a flowchart diagram illustrating a method of monitoring the state of health of a power electronic system.

With reference to FIG. 7, a high level flowchart diagram 60 illustrating steps of a method of generating the signal 32 is provided. The flowchart diagram 60 includes steps 62, 64, 68, 70, 72, 74, 76, 78, 80, and 82. The method of generating the signal 32 may implemented through an algorithm, machine executable code, or a software program programmed into a suitable programmable logic device(s) of the system 30, such as the controller 40. Although the various steps shown in the flowchart diagram 60 appear to occur in a chronological sequence, at least some of the steps may occur in a different order, and some steps may be performed concurrently or not at all.

The method can be applied between hundreds of microseconds to tens of seconds to estimate the transient or steady-state thermal impedance of the circuit element in the power conversion system 34. Alternatively, the method can be applied for any suitable length of time.

The method may be performed during the start-up and/or shut-down processes of the power conversion system 34, or when the motor 38 is not running. In addition, the method may be performed during a break in a normal operation cycle of the inverter 46. After method is applied to the system 30, normal operation of the power conversion system 34 can resume.

Figure 8:
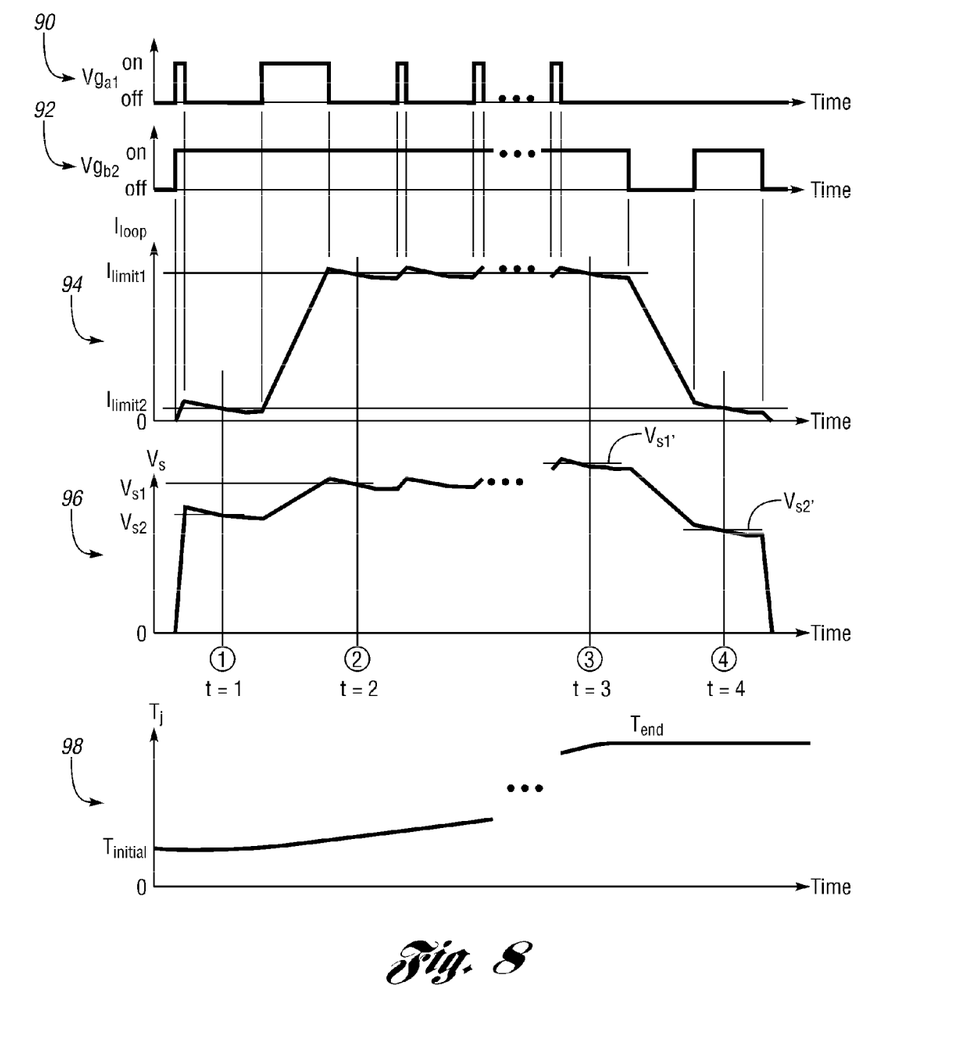
FIG. 8 is a set of graphs illustrating one possible test sequence to apply the method of FIG. 7 to the power conversion system of FIG. 3.
Figure 9A:
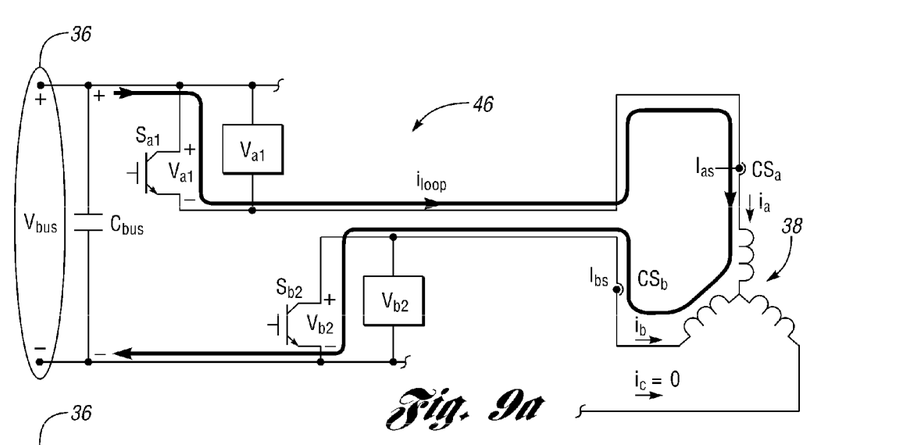
FIG. 9(a) is a schematic diagram illustrating the related components, voltages, and currents of FIG. 3 when the test sequence of FIG. 8 switches ON circuit elements $S_{a1}$ and $S_{b2}$ in the power conversion system.
Figure 9B:
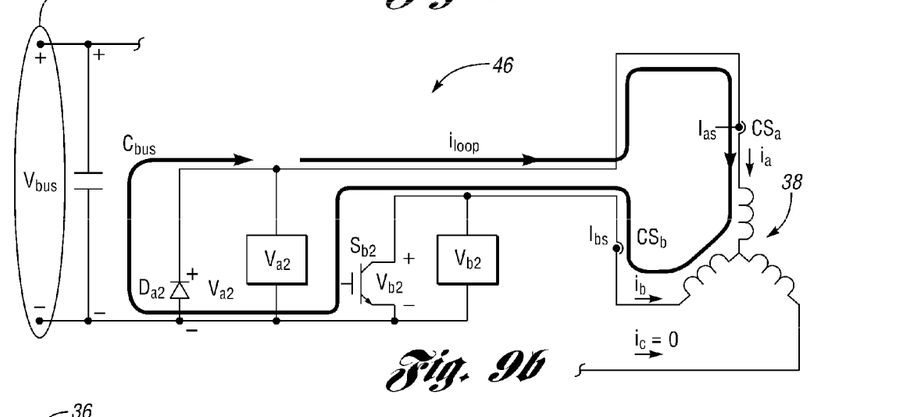
FIG. 9(b) is a schematic diagram illustrating the related components, voltages, and currents of FIG. 3 when the test sequence of FIG. 8 switches OFF circuit element $S_{a1}$ and switches ON circuit element $S_{b2}$ in the power conversion system.
Figure 9C:
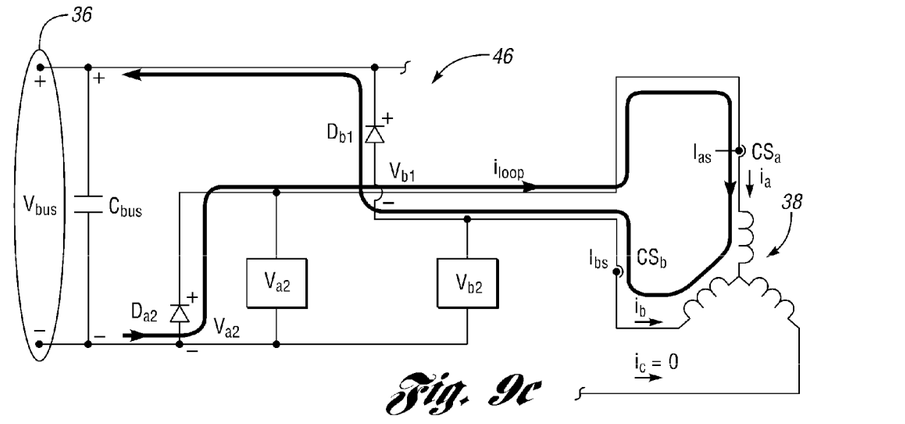
FIG. 9(c) is a schematic diagram illustrating the related components, voltages, and currents of FIG. 3 when the test sequence of FIG. 8 switches OFF circuit elements $S_{a1}$ and $S_{b2}$ in the power conversion system.

FIG. 8 generally illustrates one possible test sequence to apply the method while FIGS. 9(a)-(c) show the related components, voltages, and currents associated with the test sequence shown in FIG. 8. The system 30 and its components illustrated in FIGS. 3 and 9(a)-(c) are referenced throughout the discussion of the method to facilitate understanding of various aspects of the present invention. While FIGS. 8 and 9(a)-(c) further describe the system 30 and the method of generating the signal 32, the test sequence described and illustrated herein is not to be construed as limiting the invention to any particular operation, implementation, or configuration. In addition, the pattern of switching configurations described below are examples and do not describe all possible switching configurations of the inverter 46.

The flowchart diagram 60 illustrates an implementation of the one possible test sequence. To implement the test sequence, waveforms of FIG. 8 start with a pre-test region, which corresponds to an interval before time t=1. At time t=1, the controller 40 turns on the switches $S_{a1}$ and $S_{b2}$ to generate an electrical pulse having small loop current $I_{loop}$ with a known amplitude (slighter higher than $I_{limit2}$ in this example). The loop current flows through $S_{a1}$ and $S_{b2}$ when these switches are on, and through $D_{b2}$ and $S_{b2}$ after $S_{a1}$ is off while $S_{b2}$ remains on. When the loop current $I_{loop}$ is flowing, the voltage drops across the circuit elements are measured. Based on the measured voltage drops and the known current amplitude, the controller 40 can estimate the internal temperature of the circuit elements. Then, $S_{a1}$ and $S_{b2}$ can be turned on again to pump the loop current to a much higher current ($I_{limit1}$ in this example) that is conducted through these same circuit elements between times t=2 and t=3 to heat the circuit element. The length of time can be sufficiently long so that the internal temperatures of the circuit elements are relatively stabile at their elevated temperatures, and the steady-state thermal performance can be estimated. Or, it can be short and the transient thermal impedance can be evaluated. Next, the heating cycle is over by turning off all switches and the controller 40 reduces the intensity of the loop current $I_{loop}$ to at or near current $I_{limit2}$, as shown at time t=4 in FIG. 8. Again, the voltage drops across the devices are measured and the controller 40 estimates the internal temperatures of the circuit elements. Based on the estimated initial internal temperatures and the final temperatures, a temperature increase in the circuit elements can be estimated. In addition, the controller 40 can estimate the thermal impedance of the circuit element based on the power loss in the circuit element and the corresponding temperature increase.

To deliver the high current amplitude $I_{limit1}$, the controller 40 controls the main power circuit to regulate the load current around the desired amplitude. Similarly, this approach can be applied to regulate the current around a much smaller level $I_{limit2}$. However, if $I_{limit2}$, is very small, the power conversion system 34 may include a bias circuit to produce $I_{limit2}$ in the circuit element at a near constant rate as the inverter 46 operates.

FIG. 8 illustrates waveforms 90, 92, 94, 96, and 98 according to the one possible test sequence. Times t=1, t=2, t=3, and t=4 represent non-overlapping times when the speed of the motor 38 is relatively low or zero. When the speed of the motor 38 is low or zero, the associated back EMF of the motor 38 is negligible and the inverter 46 modulates the motor current ($I_{loop}$) very little or not at all. At times t=1, t=2, t=3, and t=4, the controller 40 controls the inverter 46 via the control signal 50 such that the motor current ($I_{loop}$) freewheels and the rate that motor current ($I_{loop}$) changes is relatively low. When the rate that motor current ($I_{loop}$) changes is relatively low and the inverter 46 modulates the motor current relatively infrequently, any switching noise from the circuit elements in the inverter 46 is negligible and the switching losses are also negligible. At times t=1, t=2, t=3, and t=4, the inverter 46 receives the control signal 50 from the controller 40 such that $Vg_{a1}$ is in the OFF state (see waveform 90), $Vg_{b2}$ is in the ON state (see waveform 92), IGBT $S_{a1}$ is in the OFF state, and IGBT $S_{b2}$ is in the ON state. When the rate that the motor current ($I_{loop}$) changes is relatively low and switching noise is negligible, the voltage across the circuit element is relatively stable and a voltage sensor (e.g., $V_{a1}$, $V_2$, $V_{b1}$, $V_{b2}$, $V_{c1}$, and $V_2$) can obtain a voltage measurement with greater accuracy.

As shown in FIG. 8, waveforms 90 and 92 represent the gate voltage ($V_g$) that the inverter 46 applies to the power switches 44 based on the control signal 50 transmitted from the controller 40. Recall, the gate voltages $Vg_{a1}$, $Vg_{a2}$, $Vg_{b1}$, $Vg_{b2}$, $Vg_{c1}$ and $Vg_{c2}$ (shown in FIG. 3) control the switching state of the respective power switches 44. In this test sequence, waveform 90 indicates the gate voltage $Vg_{a1}$ applied to IGBT $S_{a1}$ while waveform 92 indicates the gate voltage $Vg_{b2}$ applied to IGBT $S_{b2}$.

Waveform 94 of FIG. 8 shows an electrical pulse that the controller 40 applies to the circuit element. The electrical pulse of FIG. 8 is shown as motor current ($I_{loop}$) applied to the circuit element. The motor current ($I_{loop}$) of the electrical pulse represents current flowing through the motor 38 during any particular switching configuration of the inverter 46. However, it should be understood that the electrical pulse applied to the circuit element can be a voltage signal that applies voltage instead of current. The controller 40 receives feedback signals $i_{as}$, $i_{bs}$, and $i_{cs}$ from current sensors $CS_a$, $CS_b$, $CS_c$ (illustrated in FIG. 3) to obtain the electrical pulse at the desired current levels at times t=1, t=2, t=3, and t=4. For example, the controller 40 can control the inverter 46 based on feedback signals $i_{as}$, $i_{bs}$, and $i_{cs}$ to obtain the motor current ($I_{loop}$) equal to $I_{limit1}$ at times t=2 and t=3 and $I_{limit2}$ at times t=1 and t=4. $I_{limit1}$ and $I_{limit2}$ (shown in FIG. 8) represent two different predetermined values of motor current ($I_{loop}$) that the controller 40 can access from the memory 42 and apply to the circuit element as part of the electrical pulse.

Waveform 96 of FIG. 8 indicates the electrical parameter measured from the circuit element that corresponds to the waveform 94 applied to the circuit element over time. Since the electrical pulse of FIG. 8 is shown as motor current ($I_{loop}$) applied to the circuit element, the electrical parameter that waveform 96 represents is voltage. In this example, the system 30 includes voltage sensors $V_{a1}$, $V_{a2}$, $V_{b1}$, $V_{b2}$, $V_{c1}$, and $V_{c2}$ (illustrated in FIG. 3) to sense the electrical parameter across each circuit element in the power conversion system 34 to obtain waveform 96.

Waveform 98 of FIG. 8 indicates the temperature of the circuit element before and after the electrical pulse is applied to the circuit element. For example, the temperature of the circuit element illustrated in waveform 98 can represent the hot spot temperature of the power switch 44. Temperature $T_{initial}$ represents an initial temperature of the circuit element, such as before time t=1. For example, during time t=1 temperature $T_{initial}$ may represent the temperature of the circuit element before starting of the motor 38, when the vehicle is "key on", stopped at a red traffic light, soon after "key off", or other times when the power conversion system 34 operates a relatively low rate or idle. Temperature $T_{end}$ represents an end temperature of the circuit element, such as after time t=3 or when the internal temperature of the circuit element is heated to a value greater than the initial temperature of the circuit element.

Referring again to FIG. 7, step 62 of the flowchart diagram 60 includes obtaining data representing an initial expected temperature of the circuit element. The initial expected temperature can be calculated based on pre-stored characterization data, the voltage across the circuit element, and the current through the circuit element. According to the one possible test sequence illustrated in FIG. 8, the initial expected temperature of the circuit element may be obtained during a pre-heating time, such as at or around time t=1. Alternatively, the initial expected temperature can be obtained from a thermal sensor in the power conversion system 34. When there is no current through the circuit element, the power loss is zero and the circuit element can be at the same temperature with the heat sink and the coolant. The thermal sensor senses the temperature of one or more of the circuit elements, the heat sink, or the cooling channel, and provides a signal embedded or encoded with the temperature of the circuit element to the controller 40. Furthermore, in case that the calculated temperature based on pre-stored data does not match within a certain degree what is reported from the temperature sensor, the controller 40 may reprogram or recalibrate the initial expected temperature of the circuit element so that equations or lookup tables stored in the memory 42 of the controller 40 reflect how the circuit element responds to a change in temperature.

In another example, the initial expected temperature corresponds to a temperature expected of the circuit element prior to heating the circuit element, such as around time t=1. The initial expected temperature may be obtained and stored in the memory 42 when the circuit element is calibrated. Calibration of the circuit element may occur when the circuit element is relatively cool and has not experienced many operating cycles. In such an example, the controller 40 may receive the signal embedded or encoded with the temperature of the ambient, the heat sink, or the cooling channel around the circuit element to calibrate the initial expected temperature. Calibration of the circuit element may also occur at a different temperature to calculate the corresponding 'm' of the circuit element. This process can be done in a temperature chamber where the temperature can be controlled. Or, a different temperature for the circuit element other than the ambient one can be made possible, by operating the system at high power for sufficient long time, which heats up the circuit element, the heat sink, and the cooling channel. Then, the system is off for a time sufficient such that the circuit element is roughly at the same temperature of the heat sink or the cooling channel. Under such a condition, the controller 40 may collect the corresponding voltage and current for the second calibration point. Based on the data collected from the first and the second calibration points, the slope parameter 'm' can be calculated.

The controller 40 may use the temperature of a heat sink or the coolant surrounding the semiconductor die 22 to calibrate the initial expected temperature. For example, the controller 40 may obtain the temperature of the heat sink or the coolant surrounding the semiconductor die having circuit element to obtain the initial expected temperature of the circuit element when the circuit element has been switched OFF for a sufficient amount of time and therefore is relatively cool. A temperature sensor of the heat sink may sense the temperature of the heat sink 24. Similarly, a temperature sensor of the coolant at inlet may sense the temperature of the coolant to provide the initial expected temperature of circuit element.

As shown in FIGS. 9(a)-9(c), the one possible test sequence involves generating the signal 32 based on how two of the power switches 44 and its circuit elements therein in the power conversion system 34 are operating. The first power switch 44 has IGBT $S_{a1}$ and diode $D_{a1}$ while the second power switch 44 has IGBT $S_{b2}$ and diode $D_{b2}$.

At step 64, an initial value of an electrical parameter of the circuit element is obtained. As mentioned above, the initial value of the electrical parameter can be either a voltage value or a current value. The controller 40 obtains the initial value of the electrical parameter when the circuit element is at or near the initial expected temperature, such as around time t=1 or when the controller 40 receives the signal embedded or encoded with the temperature of the heat sink or coolant around the circuit element.

Figure 10:
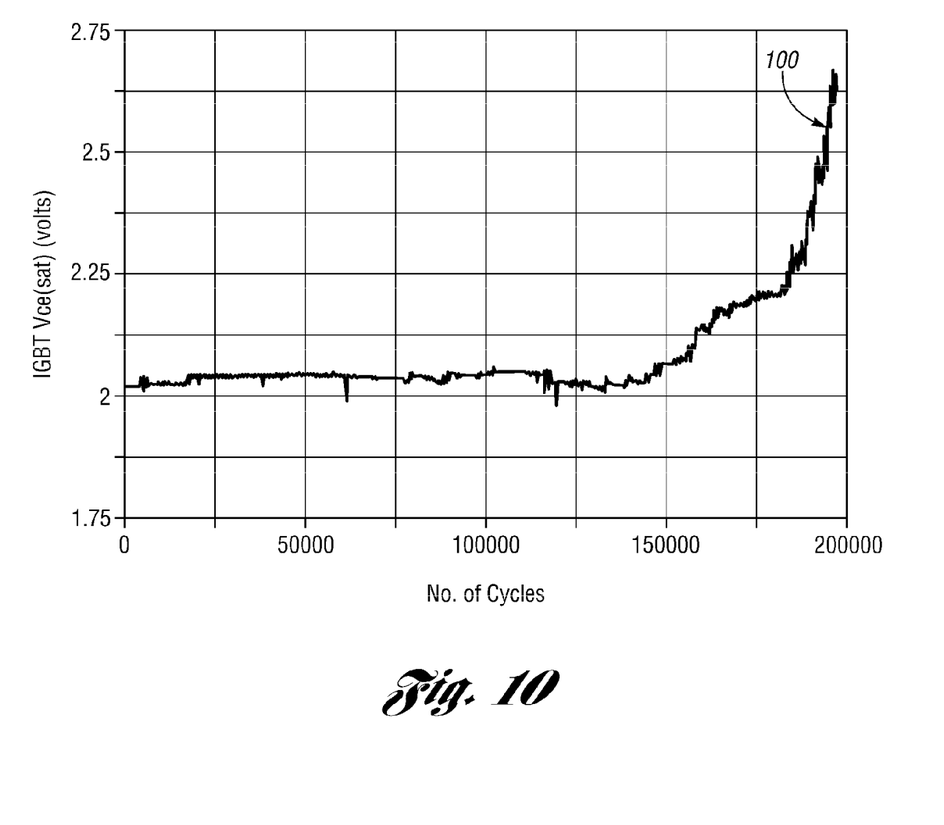
FIG. 10 is a graph illustrating the circuit element having increased stress as the circuit element experiences additional cycles.

As shown in FIGS. 9(a) and 10, the controller 40 can control the inverter 46 to obtain one or more initial values of the electrical parameter at time t=1 when the rate that the motor current ($I_{loop}$) changes is relatively low and switching noise is negligible in the circuit elements. This allows the controller 40 obtain the initial value the electrical parameter with greater accuracy.

To obtain the initial value of the electrical parameter prior to or around time t=1, the controller 40 transmits the control signal 50 to the inverter 46 to switch ON $S_{a1}$ and $S_{b2}$ before time t=1 (shown in FIG. 9(a)). During this switching configuration of the inverter 46 when $S_{a1}$ and $S_{b2}$ are switched ON, the current $I_{loop}$ flows through the windings of the motor 38, phase current $i_{as}$ is approximately equal to $i_a$ (or $-i_b$), and phase current $i_c$ is approximately zero. When $S_{a1}$ and $S_{b2}$ are switched ON, the motor current ($I_{loop}$) flows through IGBT $S_{a1}$ and IGBT $S_{b2}$. As $S_{a1}$ and $S_{b2}$ remain switched ON, the magnitude of the motor current ($I_{loop}$) increases (as waveform 94 illustrates in FIG. 8 when $Vg_{a1}$ and $Vg_{a2}$ are "on" before time t=1). When $I_{loop}$ of FIG. 9(a) becomes slightly higher than $I_{limit2}$ (as waveform 94 shows in FIG. 8 immediately before time t=1), the controller 40 transmits the control signal 50 to switch OFF $S_{a1}$ and maintain $S_{b2}$ in the ON state. When $S_{a1}$ is switched OFF and $S_{b2}$ remains ON, the motor current ($I_{loop}$) flows through IGBT $S_{b2}$ and diode $D_{a2}$. To switch OFF $S_{a1}$ the control signal 50 switches $Vg_{a1}$ to the OFF state. To maintain $S_{b2}$ in the ON state, the control signal 50 maintains $Vg_{b2}$ in the ON state. When $Vg_{a1}$ is switched OFF (as waveform 90 shows immediately before time t=1 in FIG. 8), $S_{a1}$ becomes switched OFF and current $I_{loop}$ decreases somewhat gradually (as waveform 94 shows before and after time t=1).

When $I_{loop}$ is approximately equal to $I_{limit2}$ at time t=1, as waveform 94 illustrates in FIG. 8, the initial value of the electrical parameter of the circuit element is sensed and transmitted to the controller 40 via the feedback signal 52 along the communication path 54. In this example, the electrical parameter is voltage, which waveform 96 illustrates in FIG. 8. To obtain the initial value of the electrical parameter applied across both $D_{a2}$ and $S_{b2}$ when $I_{loop}$ approximately equals $I_{limit2}$ at time t=1 (as waveform 94 shows in FIG. 8), voltage sensor $V_{a2}$ senses the voltage ($V_{a2}$) across $D_{a2}$ and sensor $V_{b2}$ senses the voltage $V_{b2}$) across $S_{b2}$ as shown in FIG. 9(b). The electrical parameters $V_{a2}$ and $V_{b2}$ around time t=1 indicate the voltages across $D_{a2}$ and $S_{b2}$ respectively when the circuit elements in the inverter 46 are at relatively low temperatures and the electrical pulse flowing through the inverter 46 has a relatively low current magnitude (e.g., $I_{limit2}$). The voltage measurements $V_{a2}$ and $V_{b2}$ from the voltage sensors are examples of two initial values of the electrical parameter that the feedback signal 52 can transmit to the controller 40 along the communication path 54. In other switching configurations of the inverter 46, the controller 40 can obtain the initial value of the electrical parameter of other circuit elements in the power conversion system 34.

At step 66 of the flowchart diagram 60 illustrated in FIG. 7, an electrical pulse is applied to the circuit element (e.g., IGBT $S_{a1}$, diode $D_{a1}$, IGBT $S_{b2}$, and/or diode $D_{b2}$) described in this test sequence and illustrated in FIGS. 9(a)-9(c) and 10. The controller 40 transmits the control signal 50 to the inverter 46 in the power conversion system 34 to apply the electrical pulse to the circuit element. The electrical pulse heats the circuit element, which increases the temperature of the circuit element from an initial temperature to a value greater than the initial temperature.

The electrical pulse applied to each circuit element in the inverter 46 can be either a current pulse or a voltage pulse. If the electrical pulse is a voltage pulse then the electrical pulse has voltage values. Similarly, if the electrical pulse is a current pulse then the electrical pulse has current values. Waveform 96 of FIG. 8 shows the electrical pulse as a current pulse.

The electrical pulse, as shown as waveform 96 in FIG. 8, can be short (a fraction of a second or shorter) or long (tens of seconds or longer). For example, the electrical pulse can be between hundreds of microseconds to tens of seconds depending on the configuration of the system 30.

As shown in FIGS. 9(*a*) and 10, the controller 40 can control the inverter 46 to apply the electrical pulse to one or more circuit elements in the inverter 46. For example, to apply the electrical pulse to the first and second power switches 44 having respective $S_{a1}$ and $S_{b2}$, the controller 40 transmits the control signal 50 to the inverter 46 to switch ON $S_{a1}$ and $S_{b2}$ between times t=1 and t=2 (shown in FIG. 8). As waveform 94 illustrates in FIG. 8 between times t=1 and t=2, the current $I_{loop}$ flowing through windings of the motor 38 increases in magnitude until the controller 40 switches OFF $Vg_{a1}$. When $Vg_{a1}$ is switched OFF (as waveform 90 shows before time t=2 in FIG. 8), $S_{a1}$ becomes switched OFF and current $I_{loop}$ decreases somewhat gradually. When $I_{loop}$ of FIG. 9(*a*) becomes slightly higher than $I_{limit1}$ (as waveform 94 generally shows in FIG. 8) between times t=1 and t=2, the controller 40 transmits the control signal 50 before time t=2 to switch OFF $S_{a1}$ and maintain $S_{b2}$ in the ON state. When $Vg_{a1}$ is switched OFF (as waveform 90 shows between times t=1 and t=2 in FIG. 8), $S_{a1}$ becomes switched OFF and current $I_{loop}$ decreases somewhat gradually (as waveform 94 shows between times t=1 and t=2 in FIG. 8). When $I_{loop}$ decreases too much away from $I_{limit1}$, $S_{a1}$ and $S_{b2}$ can be both turned on again to boost the loop current to a level above $I_{limit1}$, and then turn off $S_{a1}$ again to let the current free-wheel. This pattern repeats to maintain the loop current around a high level ($I_{limit1}$ in this example). If the motor back emf is low, this pattern can be repeated at a low rate, such as a few hundred Hertz or lower. Therefore, the loss of the circuit element is dominant by conduction, and the switching loss is very minor. The conduction loss of the circuit element is approximately equal to the voltage drop across this circuit element times the current through the circuit element. When the electrical pulse heats the circuit element, the electrical pulse flowing through the inverter 46 has a relatively high current magnitude (e.g., $I_{limit1}$).

Referring to FIG. 8, the electrical pulse applied to the circuit elements in the inverter 46 causes the circuit elements to heat to a greater temperature, especially between times t=2 and t=3 when $S_{a1}$ can periodically switch ON and OFF while maintaining $S_{b2}$ in the ON state to maintain $I_{loop}$ approximately equal to $I_{limit1}$. As $S_{a1}$ switches ON and OFF, $D_{a2\ and\ Sb2}$ will heat to a greater temperature. To maintain the motor current ($I_{loop}$) at the desired amplitude range, $S_{a1}$ and $S_{b2}$ in the power switches 44 of this example can be modulated intermittently to boost up the current amplitude of the electrical pulse to the desired level (e.g., $I_{limit1}$ as waveform 94 shows in FIG. 8). Or, when a higher current amplitude of the electrical pulse is desired, then the controller 40 can control the inverter 46 to switch ON $S_{a1}$ and $S_{b2}$ for a longer time to ramp up the electrical pulse to a higher level. Then, the electrical pulse is in the free-wheeling state again (at a higher circulating current) and the voltage and current can be recorded with little disturbance. When the electrical pulse is at higher current, conduction loss of the circuit element is higher, which increases the temperature of the circuit element.

In addition to applying the electrical pulse to one or more circuit elements in the inverter 46, the controller 40 can also obtain values of the electrical parameter across the circuit element while the electrical pulse heats the circuit element. For example, as $I_{loop}$ decreases somewhat gradually between times t=1 and t=2 (as waveform 94 shows in FIG. 8), voltage sensors $V_{a2}$ and $V_{b2}$ can sense and transmit the electrical parameters $V_{a2}$ and $V_{b2}$ of the circuit element to the controller 40 via the feedback signal 52 transmitted along the communication path 54. At time t=2 when $I_{loop}$ is approximately $I_{limit1}$ (as waveform 94 shows in FIG. 8), voltage sensor $V_{a2}$ senses the voltage ($V_{a2}$) across $D_{a2}$ and voltage sensor $V_{b2}$ senses the voltage $V_{b2}$) across $S_{b2}$ as shown in FIG. 9(*b*). The electrical parameters $V_{a2}$ and $V_{b2}$ at time t=2 indicate the voltage across $D_{a2}$ and $S_{b2}$ respectively when the circuit elements are heating in the inverter 46. Similarly, the controller 40 can obtain the electrical parameters $V_{a2}$ and $V_{b2}$ during times t=3 and t=4.

At step 68, the electrical parameter of the circuit element is sensed at t=4 after the electrical pulse decays to a predetermined value ($I_{limit2}$ in this example). The controller 40 can obtain the predetermined value from the memory 42 to estimate temperature of the circuit element based on the pre-stored data and the measured voltage across the circuit element and the current through the circuit element. The controller 40 can control the inverter 46 such that the electrical pulse applied to the circuit element decays to the predetermined value. More specifically, the controller 40 transmits the control signal 50 to the inverter 46 to switch OFF both $S_{a1}$ and $S_{b2}$ between times t=3 and t=4 of FIG. 8. As waveform 94 illustrates in FIG. 8 between times t=3 and t=4, the current $I_{loop}$ flowing through windings of the motor 38 decreases in magnitude. In this test sequence, both $S_{a1}$ and $S_{b2}$ are switched OFF to allow $I_{loop}$ to decrease from $I_{limit1}$ to a level slightly higher than $I_{limit2}$. $I_{limit2}$ is equal to the predetermined value in this test sequence. When $I_{loop}$ decreases to about $I_{limit2}$, the controller 40 switches $Vg_{b2}$ from OFF to ON. When $Vg_{b2}$ is switched ON (as waveform 92 shows before time t=4), $S_{b2}$ becomes switched ON and current $I_{loop}$ decreases somewhat slower compared to when both $S_{a1}$ and $S_{b2}$ were OFF between times t=3 and t=4. At time t=4, when $I_{loop}$ decreases somewhat gradually, voltage sensors $V_{a2}$ and $V_{b2}$ sense and transmit the electrical parameters $V_{a2}$ and $V_{b2}$ of the circuit element to the controller 40 along the communication path 54. Around time t=4 when $I_{loop}$ is approximately equal to the predetermined value (e.g., $I_{limit2}$ as shown in FIG. 8), the electrical parameter of the circuit element is sensed.

After the electrical pulse decays to the predetermined value and the circuit element is heated, one or more of the voltage sensors $V_{a1}$, $V_{a2}$, $V_{b1}$, $V_{b2}$, $V_{c1}$, $V_{c2}$ can sense the electrical parameter of the circuit element to obtain a subsequent value of the electrical parameter. For example, to sense the electrical parameter of the circuit elements of $D_{a2}$ and $S_{b2}$, voltage sensor $V_{a2}$ senses the voltage ($V_{a2}$) across $D_{a2}$ and voltage sensor $V_{b2}$ senses the voltage ($V_{b2}$) across $S_{b2}$ as shown in FIG. 9(*b*). The electrical parameters $V_{a2}$ and $V_{b2}$ around or at time t=4 indicate the voltage across $D_{a2}$ and $S_{b2}$ respectively when the electrical pulse flowing through the inverter 46 decays to the predetermined value (e.g., $I_{limit2}$). Recall, the electrical parameter can be either a voltage or a current and, therefore, the subsequent value of the electrical parameter can be either a voltage value or a current value. Based on sensing the electrical parameter of the circuit element, the controller 40 can obtain the subsequent value of the electrical parameter via the feedback signal 52 transmitted along the communication path 54.

At step 70 of the flowchart diagram 60 shown in FIG. 7, a subsequent temperature (T) of the circuit element is estimated. The controller 40 can estimate the subsequent temperature (T) based on the subsequent value of the electrical parameter. The controller 40 can store and access values representing the initial expected temperature of the circuit element, the initial value of the electrical parameter, the subsequent value of the electrical parameter, and the predetermined value of the electrical pulse to and from the memory 42.

As shown in FIGS. 7-8, the voltage across the circuit elements of the power switches 44 is a function of the motor current ($I_{loop}$) and the temperature of the circuit element. This relationship of the voltage across the circuit element based on the temperature of the circuit element and the motor current ($I_{loop}$) flowing through the circuit element can be stored in the memory 42 of the controller 40. For example, the relationship of voltage across the circuit element based on the temperature of the circuit element for a given value of the electrical pulse (e.g., using motor current or loop) can be stored as a constant value "m" when the relationship between voltage across the circuit element and the temperature of the circuit element is generally linear. More specifically, the relationship may be stored in the memory 42 as an analytical equation, such as $V=V_0+m*(T-T_0)$ or $T=T_0+(V-V_0)/m$ mentioned above where "T" represents the subsequent temperature that the controller 40 estimates. In another example, the value of "m" may be stored as a lookup table in the memory 42. In addition, the value of "m" may be edited and programmed in the memory 42. For example, the controller 40 may edit or reprogram the value of "m" stored in the memory 42, such as during a calibration cycle of the system 30. In such an example, the controller 40 may dynamically "learn" or customize the value of "m" or the relationship between the value of $T-T_0$ and the value of $V-V_0$ for each circuit element in the power conversion system 34.

As shown in FIG. 8, when the controller 40 applies the electrical pulse at the predetermined value (e.g., $I_{limit2}$), the value of "m" is generally constant. Thus, the voltage across the circuit element can be represented as $V=V_0+m*(T-T_0)$ when the value of the electrical pulse, and therefore the value of "m", is known. The value of "m" is based on how an IGBT, diode, or other circuit element responds to the electrical pulse at a particular value. Therefore, the controller 40 can estimate the subsequent temperature (T) based on after obtaining the following inputs from the memory 42: the subsequent value of the electrical parameter (V), the initial value of the electrical parameter ($V_0$), the initial expected temperature of the circuit element ($T_0$), and the value of "m", which is calculated or looked up from the memory 42 based the predetermined value of the electrical pulse. As shown in FIG. 8, the subsequent temperature (T) may be represented as temperature $T_{end}$ as labeled near waveform 98. Furthermore, the controller 40 may obtain the subsequent temperature (T) when the regular operation of the power conversion system 34 is halted.

At step 72 of the flowchart diagram 60 shown in FIG. 7, a temperature comparison is obtained. The controller 40 compares the subsequent temperature obtained in step 70 to a predetermined temperature to obtain the temperature comparison. The controller 40 can access the predetermined temperature from the memory 42. If the subsequent temperature is greater than the predetermined temperature, then the controller 40 may obtain a temperature comparison indicating that the circuit element has overheated and/or that the circuit element is operating abnormally. For example, the circuit element may operate abnormally due to an unexpected increase in thermal impedance of the circuit element. If the subsequent temperature is not greater than the predetermined temperature, then the controller 40 may obtain a temperature comparison indicating that the circuit element is operating as expected.

At step 74, a temperature difference is estimated. The controller 40 estimates the temperature difference ($\Delta T$) between the subsequent temperature obtained at step 70 and the initial expected temperature obtained at step 62. In other words, the controller 40 can estimate how much the circuit element changed temperature from around time t=1 to around t=4 under the same predetermined power loss. Furthermore, the controller 40 may compare the temperature difference to a predetermined temperature difference to determine whether the temperature difference has exceeded the predetermined temperature difference.

The test sequence show in FIGS. 9(a)-(c) and 10 can provide the controller 40 with information to calculate a temperature difference for two circuit elements—diode $D_{a2}$ and IGBT $S_{b2}$. Temperature difference $\Delta T_D$ represents the temperature difference for diode $D_{a2}$ between time t=1 and time t=4 while temperature difference $\Delta T_S$ represents the temperature difference of IGBT $S_{b2}$ between time t=1 and time t=4. Thus, the controller 40 information about diode $Da_2$ to obtain $\Delta T_D$ and information about IGBT $S_{b2}$ to obtain $\Delta T_S$. The controller 40 may use temperature differences $\Delta T_D$ and $\Delta T_S$ to indicate whether the respective circuit element, or the power conversion system 34 as a whole, is operating as expected.

To estimate temperature difference $\Delta T_D$, the controller 40 can use the following equation $\Delta T_D=m_D(V-V_0)$ or lookup table corresponding to such equation stored in the memory 42. The controller 40 obtains the initial value of the electrical parameter ($V_{0D}$) from step 64, the value of "$m_D$" that corresponds to the predetermined value of the circuit element (i.e., diode $Da_2$) from step 68, and the subsequent value of the electrical parameter ($V_D$) from step 70 to estimate the temperature difference $\Delta T_D$. $\Delta T_D$ indicates how diode $D_{a2}$ responds when the electrical pulse heats diode $D_{a2}$ between times t=1 and t=4.

Similarly, the controller 40 uses the following equation $\Delta T_S=m_S(V_S-V_{OS})$ or lookup table corresponding to such equation stored in the memory 42 to estimate temperature difference $\Delta T_S$. The controller 40 obtains the initial value of the electrical parameter ($V_{OS}$) from step 64, the value of "$m_S$" that corresponds to the predetermined value of the circuit element (i.e., IGBT $S_{b2}$) from step 68, and the subsequent value of the electrical parameter ($V_S$) from step 70 to estimate the temperature difference $\Delta T_S$. $\Delta T_S$ indicates how IGBT $S_{b2}$ responds when the electrical pulse heats IGBT $S_{b2}$ between times t=1 and t=4.

At step 76, a temperature difference comparison is obtained. Recall, the rate of temperature change of the circuit element can indicate whether the circuit element has one or more problems. The controller 40 can obtain the temperature difference comparison in a number of ways.

In one example, the controller 40 obtains the temperature difference comparison based on a predetermined temperature difference under the same power loss. The controller 40 can access the predetermined temperature difference from the memory 42. Furthermore, the controller 40 can store the predetermined temperature difference in the memory 42, such as when the circuit element is being calibrated or tested. In operation, the controller 40 compares the temperature difference estimated at step 74 to the predetermined temperature difference to obtain the temperature difference comparison. If the temperature difference estimated at step 74 is greater than the predetermined temperature difference, then the controller 40 can obtain a temperature difference comparison indicating that the circuit element has overheated and/or that the circuit element is operating abnormally. For example, the circuit element may operate abnormally due to an unexpected increase in thermal impedance of the circuit element. If the temperature difference estimated at step 74 is not greater than the predetermined temperature difference, then the controller 40 can obtain a temperature difference comparison indicating that the circuit element is operating as expected.

In another example, the controller 40 compares the temperature difference estimated at step 74 to a predetermined temperature range stored in the memory 42 to obtain the temperature difference comparison. If the temperature difference estimated at step 74 is outside the predetermined temperature range, then the controller 40 can obtain a temperature difference comparison indicating that the circuit element has overheated and/or that the circuit element is operating abnormally or has one or more problems. In contrast, if the temperature difference estimated at step 74 is within the predetermined temperature range, then the controller 40 can obtain a temperature difference comparison indicating that the circuit element is operating as expected.

At step 78, a thermal impedance ($Z_{thermal}$) is estimated. The controller 40 estimates the thermal impedance of the circuit element based on an estimated power loss (P) of the circuit element due to the electrical pulse and the temperature difference ($\Delta T$) estimated at step 74. The calculation or lookup table representing the relationship between the estimated power loss (P) of the circuit element and the temperature difference ($\Delta T$) can be expressed based on the following equation $$Z_{thermal} = \frac{\Delta T}{P} = \frac{\Delta T}{V \cdot I}.$$

This relationship can be stored in the memory 42. Based on the stored data in the memory 42, the controller 40 can estimate the thermal impedance of the circuit element relatively quickly. The controller 40 may obtain the thermal impedance when the thermal impedance of the circuit element has transient or steady-state thermal impedance.

In one example, the controller 40 can obtain the estimated power loss (P) of the circuit element based on the following exemplary equation: $P=(V_{s1})*(I_{s1\_limit1})$. The controller 40 obtains $V_{s1}$ when the value of the electrical pulse applied to the circuit element is at or around $I_{s1\_limit1}$. $V_{s1}$ may be referred to as a corresponding upper value of the electrical parameter. For example, $V_{s1}$ is obtained at time t=2 or t=3 (see waveform 98 at time t=2 or t=3 in FIG. 8) when the value of the electrical pulse applied to the circuit element is $I_{s1\_limit1}$, (see waveform 96 at time t=2 in FIG. 8). In such an example, the controller 40 commands the voltage sensors to sense the electrical parameter of the circuit element to obtain the corresponding upper value or $V_{s1}$ when the electrical pulse rises to $I_{s1\_limit1}$, or $I_{limit1}$ as shown in FIG. 8.

In another example, the controller 40 can obtain the estimated power loss (P) of the circuit element based on the following exemplary equation: $P=(V_{AVE})*(I_{s1\_limit1})$ where $V_{AVE}$ represents the average of $V_{s1}$ and $V_{s1}$, that the controller 40 can obtain from the voltage sensors at respective times t=2 and t=3 as shown in FIG. 8. In this example, $V_{AVE}$ may be referred to as a corresponding upper value of the electrical parameter.

At step 80, a thermal impedance comparison is obtained. Recall, the thermal impedance of the circuit element can indicate whether the circuit element has one or more problems. Therefore, the controller 40 can obtain the thermal impedance comparison to determine whether the rate of thermal impedance in circuit element has increased or decreased more than expected from the electrical pulse heating the circuit element. The controller 40 can obtain the thermal impedance comparison in a number of ways.

In one example, the controller 40 obtains the thermal impedance comparison based on a predetermined thermal impedance. The controller 40 can access the predetermined thermal impedance from the memory 42. Furthermore, the controller 40 can store the predetermined thermal impedance in the memory 42, such as when the circuit element is being calibrated or tested. In operation, the controller 40 compares the thermal impedance estimated at step 78 to the predetermined thermal impedance to obtain the thermal impedance comparison. If the thermal impedance estimated at step 78 is greater than the predetermined thermal impedance, then the controller 40 can obtain a thermal impedance comparison indicating that the circuit element has overheated and/or that the circuit element is operating abnormally. For example, the circuit element may operate abnormally due to an unexpected increase in thermal impedance of the circuit element. If the thermal impedance estimated at step 78 is not greater than the predetermined thermal impedance, then the controller 40 can obtain a thermal impedance comparison indicating that the circuit element is operating as expected.

In another example, the controller 40 compares the thermal impedance estimated at step 78 to a predetermined thermal impedance range stored in the memory 42 to obtain the thermal impedance comparison. If the thermal impedance estimated at step 78 is outside the predetermined thermal impedance range, then the controller 40 can obtain a thermal impedance comparison indicating that the circuit element has overheated and/or that the circuit element is operating abnormally or has one or more problems in the power conversion system 34. In contrast, if the thermal impedance estimated at step 78 is within the predetermined thermal impedance range, then the controller 40 can obtain a thermal impedance comparison indicating that the circuit element is operating as expected.

At step 82, the signal 32 indicating whether one or more circuit elements in the power conversion system 34 is operating as expected is generated. The controller 40 generates the signal 32 based on the subsequent temperature calculated at step 70. In addition, the controller 40 can generate the signal 32 indicating that the circuit element in the power conversion system 34 is operating as expected based on one or more of the following comparisons that indicate the circuit element is operating as expected: the temperature comparison obtained at step 72, the temperature difference comparison obtained at step 76, the thermal impedance comparison obtained at step 80, or a combination thereof. The temperature comparison obtained at step 72, the temperature difference comparison obtained at step 76, and the thermal impedance comparison obtained at step 80 are each based on the subsequent temperature calculated at step 70.

Referring again to step 82, the controller 40 can generate the signal 32 indicating that the circuit element in the power conversion system 34 is not operating as expected based on one or more of the following comparisons that indicate the circuit element is not operating as expected: the temperature comparison obtained at step 72, the temperature difference comparison obtained at step 76, the thermal impedance comparison obtained at step 80, or a combination thereof. When the circuit element is not operating as expected, the circuit element may be operating abnormally or have one or more problems. For example, the circuit element may have overheated. If the circuit element is overheated, then the circuit element may degrade or fail unless the circuit element is cooled to a temperature lower than the subsequent temperature.

With continuing reference to step 82, if the controller 40 determines that recorded data is outside an acceptable range or indicates an unacceptable trend, which can be stored in the memory 42, the controller 40 can transmit the signal 32 to provide an early warning of a problem with the circuit element, instead of waiting until the circuit element fails. The signal 32 can provide warnings ranging from friendly to urgent depending on the temperature comparison obtained at step 72, the temperature difference comparison obtained at step 76, the thermal impedance comparison obtained at step 80, or a combination thereof. Even if the signal 32 provides warnings that are urgent, the power conversion system 34 may not need to be shut down from its normal operation. The controller 40 can reduce the output power rating or temporarily increase the cooling of the circuit element to make the circuit element in the power conversion system 34 operate as expected or desired until the symptoms or root causes of the circuit element not operating as expected can be discovered or further mitigated.

With reference to FIG. 10, graph 100 shows the forward voltage drop across the circuit element under a constant forward current as the circuit element cycles. Graph 100 shows that the forward voltage drop is increasing at a greater rate as the number of cycles that the circuit element experiences increases, especially after 150,000 cycles where the circuit element is deteriorating. The system 30 and the method can store the forward voltage drop across the circuit element for a number of cycles to monitor the long-term temperature exposure and thermal impedance of the circuit element under the constant forward current. Such logged data can be used to predict the long-term reliability or health of the circuit element, when the circuit element may deteriorate or fail, or how the circuit element will perform as the number of operation cycles increases.

While embodiments of the present invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed:

1. At least one processor-readable storage medium having processor-readable code embodied thereon for programming at least one processor to perform a method of generating a signal that indicates whether a circuit element is operating as expected, the method comprising:
    obtaining an initial expected temperature, and an initial value of an electrical parameter, of the circuit element;
    applying an electrical pulse to the circuit element to increase the temperature thereof;
    sensing the electrical parameter after the electrical pulse decays to a predetermined value to obtain a subsequent value of the electrical parameter;
    estimating a subsequent temperature of the circuit element based on the initial expected temperature, the initial value, the subsequent value, and the predetermined value; and
    generating the signal based on the subsequent temperature indicative of whether the circuit element is operating as expected.

2. The storage medium of claim 1 wherein the electrical pulse is a current pulse, the predetermined value is a current value, and the initial and subsequent values of the electrical parameter are voltage values.

3. The storage medium of claim 1 wherein the electrical pulse is a voltage pulse, the predetermined value is a voltage value, and the initial and subsequent values of the electrical parameter are current values.

4. The storage medium of claim 1 further including comparing the subsequent temperature to a predetermined temperature to obtain a temperature comparison and generating the signal based on the temperature comparison.

5. The storage medium of claim 1 further including controlling the circuit element based on the signal to change the temperature of the circuit element.

6. The storage medium of claim 1 wherein the electrical pulse has a width between 1 microsecond and 10 minutes.

7. The storage medium of claim 6 wherein the width is between 1 and 10 milliseconds.

8. The storage medium of claim 1 furthering including obtaining the initial expected temperature from a hot spot of the circuit element.

9. The storage medium of claim 1 furthering including estimating a temperature difference based on the subsequent temperature and the initial expected temperature and generating the signal based on the temperature difference.

10. The storage medium of claim 1 furthering including estimating a thermal impedance of the circuit element based on the temperature difference and generating the signal based on the thermal impedance.

11. A system for generating a signal that indicates whether a circuit element is operating as expected, the system comprising:
    a computer-readable storage medium; and
    a controller in communication with the storage medium, the controller being configured to perform a method comprising:
    obtaining an initial expected temperature, and an initial value of an electrical parameter, of the circuit element;
    applying an electrical pulse to the circuit element to increase the temperature thereof;
    sensing the electrical parameter after the electrical pulse decays to a predetermined value to obtain a subsequent value of the electrical parameter;
    estimating a subsequent temperature of the circuit element based on the initial expected temperature, the initial value, the subsequent value, and the predetermined value; and
    generating the signal based on the subsequent temperature indicative of whether the circuit element is operating as expected.

12. The system of claim 11 wherein the method further includes estimating a temperature difference based on the subsequent temperature and the initial expected temperature and generating the signal based on the temperature difference.

13. The system of claim 12 wherein the method further includes comparing the temperature difference to a predetermined temperature difference and generating the signal based on the comparing.

14. The system of claim 12 wherein the method further includes estimating a thermal impedance of the circuit element based on the temperature difference and generating the signal based on the thermal impedance.

15. The system of claim 14 wherein the method further includes obtaining an impedance comparison based on the thermal impedance of the circuit element and predetermined thermal impedance information and generating the signal based on the impedance comparison.

16. The system of claim 14 wherein the thermal impedance of the circuit element is estimated based on an estimated power loss of circuit element at least partially due to the electrical pulse.

17. The system of claim 16 wherein the method further includes sensing the electrical parameter of the circuit element after the electrical pulse rises to a predetermined upper value to obtain a corresponding upper value of the electrical parameter and estimating the estimated power loss based on the corresponding upper value and the predetermined upper value.

18. The system of claim 11 wherein the method further includes accessing the data representing the initial expected temperature of the circuit element and the initial value of the electrical parameter from the computer-readable storage medium for estimating the subsequent temperature.

19. The system of claim 11 wherein the method further includes estimating a thermal impedance of the circuit element based on the subsequent temperature and generating the signal based on the thermal impedance.

* * * * *